(12) United States Patent
Ha et al.

(10) Patent No.: US 11,107,373 B2
(45) Date of Patent: Aug. 31, 2021

(54) FLEXIBLE DISPLAY DEVICE

(71) Applicant: Samsung Display Co., Ltd., Yongin-Si (KR)

(72) Inventors: Seung-Hwa Ha, Hwaseong-si (KR); Sung Sang Ahn, Hwaseong-si (KR); Jung Hun Lee, Hwaseong-si (KR); Kyu Young Kim, Suwon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/209,613

(22) Filed: Dec. 4, 2018

(65) Prior Publication Data

US 2019/0213925 A1 Jul. 11, 2019

(30) Foreign Application Priority Data

Jan. 5, 2018 (KR) .................. 10-2018-0001612

(51) Int. Cl.
| | |
|---|---|
| *G09F 9/30* | (2006.01) |
| *G06F 3/041* | (2006.01) |
| *H01L 27/32* | (2006.01) |
| *H01L 51/00* | (2006.01) |
| *H01L 51/52* | (2006.01) |
| *C09J 7/38* | (2018.01) |

(52) U.S. Cl.
CPC ............ *G09F 9/301* (2013.01); *G06F 3/0412* (2013.01); *G06F 3/0414* (2013.01); *H01L 27/323* (2013.01); *H01L 51/0097* (2013.01); *H01L 51/5246* (2013.01); *H01L 51/5281* (2013.01); *C09J 7/38* (2018.01); *G06F 2203/04102* (2013.01)

(58) Field of Classification Search
CPC ...... G09F 9/301; G09F 9/0412; G09F 9/0414; H01L 27/323; H01L 51/0097; H01L 51/5246; H01L 51/5281; C09J 7/38; G06F 2203/04102
See application file for complete search history.

(56) References Cited

U.S. PATENT DOCUMENTS

| | | | | |
|---|---|---|---|---|
| 9,793,512 | B2 * | 10/2017 | Choi ................... | H01L 51/5253 |
| 10,050,227 | B2 * | 8/2018 | Park ................... | H01L 27/3276 |
| 10,115,913 | B2 * | 10/2018 | Namkung ........... | H01L 27/3244 |
| 10,355,241 | B2 * | 7/2019 | Ahn .................... | H01L 51/5253 |
| 10,361,395 | B2 * | 7/2019 | Kajiyama ............ | G09G 3/3233 |
| 10,439,017 | B2 * | 10/2019 | Kim .................... | H01L 51/5253 |
| 10,483,098 | B2 * | 11/2019 | Um .................... | G02F 1/133305 |
| 10,522,785 | B2 * | 12/2019 | Kim .................... | H01L 51/5253 |
| 2015/0137102 | A1 * | 5/2015 | Yang ................... | B32B 37/144 |
| | | | | 257/40 |

(Continued)

FOREIGN PATENT DOCUMENTS

| | | |
|---|---|---|
| KR | 10-2015-0014713 A | 2/2015 |
| KR | 10-2017-0106591 A | 9/2017 |
| KR | 10-2017-0109724 A | 10/2017 |

*Primary Examiner* — Peter D McLoone
(74) *Attorney, Agent, or Firm* — Innovation Counsel LLP

(57) ABSTRACT

A flexible display device according to an exemplary embodiment includes: a display panel having a display area and a driving area, wherein a signal control chip controlling the display panel is mounted on the driving area; a first base film part disposed under the display area and including a metal layer; and a second base film part disposed under the driving area and formed to be transparent.

25 Claims, 14 Drawing Sheets

(56) References Cited

U.S. PATENT DOCUMENTS

| | | | |
|---|---|---|---|
| 2016/0093644 A1* | 3/2016 | Ki | H01L 29/78672 |
| | | | 257/40 |
| 2016/0172623 A1* | 6/2016 | Lee | B32B 3/04 |
| | | | 257/40 |
| 2016/0181346 A1* | 6/2016 | Kwon | H01L 27/3276 |
| | | | 257/40 |
| 2016/0293870 A1* | 10/2016 | Nakagawa | H01L 51/0097 |
| 2016/0378224 A1* | 12/2016 | Kwon | H01L 51/5256 |
| | | | 345/174 |
| 2017/0147116 A1* | 5/2017 | Lee | G06F 3/044 |
| 2017/0229489 A1 | 8/2017 | Seo et al. | |
| 2017/0271616 A1* | 9/2017 | Choi | H01L 51/5253 |
| 2017/0294609 A1* | 10/2017 | Namkung | H01L 27/3244 |
| 2017/0294620 A1* | 10/2017 | Park | H01L 27/3276 |
| 2017/0323779 A1* | 11/2017 | Um | G02F 1/133711 |
| 2018/0019417 A1* | 1/2018 | Andou | H05K 1/0269 |
| 2018/0019440 A1* | 1/2018 | Namkung | H01L 27/3276 |
| 2018/0027673 A1* | 1/2018 | Andou | H01L 27/3276 |
| | | | 361/749 |
| 2018/0108863 A1* | 4/2018 | Kajiyama | H01L 27/3276 |
| 2018/0123060 A1* | 5/2018 | Jang | H01L 27/3276 |
| 2018/0158893 A1* | 6/2018 | Tokuda | H01L 27/1248 |
| 2018/0166652 A1* | 6/2018 | Kim | B32B 7/12 |
| 2018/0204901 A1* | 7/2018 | Hwang | H01L 27/3276 |
| 2018/0315809 A1* | 11/2018 | Kim | H01L 51/0097 |
| 2019/0058028 A1* | 2/2019 | Won | H01L 27/3276 |
| 2019/0074332 A1* | 3/2019 | Kim | H01L 51/0097 |
| 2019/0096913 A1* | 3/2019 | Lee | H01L 27/124 |
| 2019/0198801 A1* | 6/2019 | Kuon | H01L 51/0097 |

* cited by examiner

FIG. 3
(A)
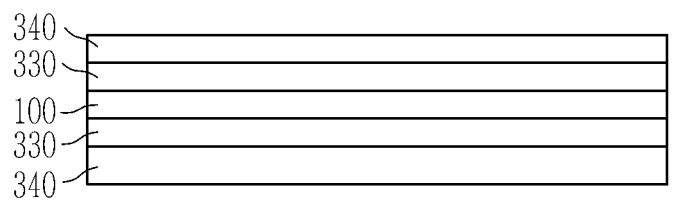
(B)
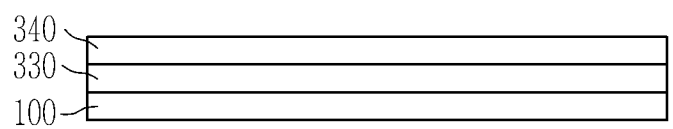
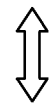
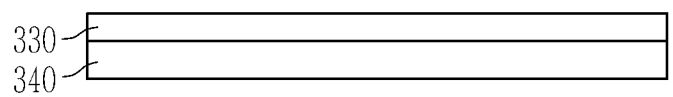

FIG. 4
(A)
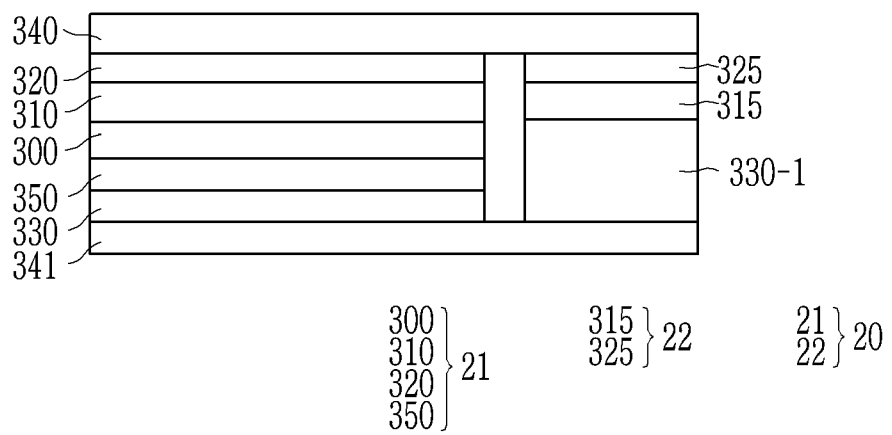
(B)
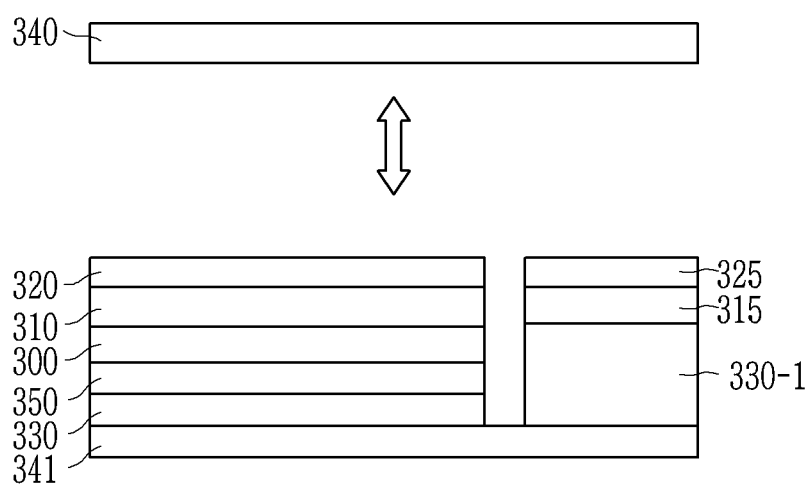

FLEXIBLE DISPLAY DEVICE

CROSS-REFERENCE TO RELATED APPLICATION

This application claims priority to and the benefit of Korean Patent Application No. 10-2018-0001612 filed in the Korean Intellectual Property Office on Jan. 5, 2018, the entire contents of which are incorporated herein by reference.

BACKGROUND

(a) Field

The present disclosure relates to a flexible display device, and in detail, relates to the flexible display device including a base film used when manufacturing the flexible display device.

(b) Description of the Related Art

A display device such as an organic light emitting diode display, etc. includes a display panel, and the display panel is manufactured by forming several layers and elements on a substrate. Conventionally, glass has been used as the substrate of the display panel. However, because the glass substrate is rigid, it is difficult to bend or deform the display device. Recently, a flexible display device using a flexible substrate such as a lightweight and easily deformable plastic has been developed.

The flexible display device may be classified into a bendable display device, a foldable display device, a rollable display device depending on a use or a shape. These flexible display devices may be bent or folded when using the flexible substrate such as plastic. However, the flexible substrate has elasticity and has a characteristic that it tends to be re-flattened even when the flexible substrate is bent. In other words, there is a drawback that it cannot maintain a certain degree of warpage.

The above information disclosed in this Background section is only for enhancement of understanding of the background of the inventive concept and therefore it may contain information that does not form the prior art that is already known in this country to a person of ordinary skill in the art.

SUMMARY

Exemplary embodiments provide a flexible display device having a base film including a metal, and provide a flexible display device having a transparent base film under a part where a driving chip is mounted even though the flexible display device has the base film including the metal.

A flexible display device according to an exemplary embodiment includes: a display panel having a display area and a driving area; a first base film part disposed under the display area and including a metal layer; and a second base film part disposed under the driving area and formed to be transparent. A signal control chip controlling the display panel is mounted on the driving area.

The first base film part and the second base film part include at least one layer formed of the same material.

The first base film part may include: a base film including a metal layer; and an adhesive layer attached to a bottom of the display area.

The second base film part may include an external adhesive layer formed of the same material as that of the adhesive layer of the first base film part.

The first base film part may further include a film layer disposed between the adhesive layer and the base film.

The second base film part may include: an external adhesive layer formed of the same material as that of the adhesive layer of the first base film part; and an external film layer formed of the same material as that of the film layer of the first base film part.

The second base film part may include a transparent layer disposed in a layer corresponding to the metal layer of the first base film part may.

The first base film part and the second base film part may respectively further include a coating layer, the first base film part may include the coating layer disposed above and below the metal layer, and the second base film part may include the coating layer disposed above and below the transparent layer.

The first base film part and the second base film part may respectively further include a coating layer, the first base film part may include the coating layer disposed above and below based on the metal layer, and the second base film part may only include the coating layer.

The first base film part may further include the coating layer, the second base film part may include a transparent layer and a coating layer, the first base film part may include the coating layer disposed above and below based on the metal layer, and the transparent layer may be disposed on the coating layer in the second base film part.

The transparent layer of the second base film part may be disposed in a layer corresponding to the metal layer of the first base film part.

The first base film part and the second base film part may respectively further include the coating layer, the coating layer may be disposed above and below based on the metal layer in the first base film part, and the coating layer may have a bent structure in the second base film part and the adhesive layer to fix the bent structure of the coating layer.

The metal layer may be formed of a metal such as aluminum or a metal sheet.

An alignment key disposed within the driving area of the display panel and disposed adjacent to the signal control chip may be further included.

A flexible printed circuit substrate attached on one side of the driving area of the display panel, and a main printed circuit board (PCB) attached on one side of the flexible printed circuit substrate, may be further included.

A touch panel disposed on the display panel and sensing a touch may be further included.

A window disposed on the touch panel may be further included.

A cushion layer may be further included under the metal layer as the first base film part.

The display panel may further include a crack preventing layer disposed on a bending area. The bending area may be disposed between the signal control chip and the first base part.

The flexible display device may further include a pressure sensor layer disposed between the signal control chip and the first base part.

According to an exemplary embodiment, as the flexible display device has the base film including the metal, it is fixed at the corresponding position during the bending and is not again unfolded. On the other hand, in the flexible display device, as the base film formed of the transparent layer may be attached under the part where the driving chip is mounted, the alignment key is recognized when mounting the driving chip, thereby correctly mounting the driving chip.

BRIEF DESCRIPTION OF THE DRAWINGS

FIG. 3 is a view showing a manufacturing step of a display panel part of the flexible display device of FIG. 1.

FIG. 4 is a view showing a manufacturing step of a base film part of the flexible display device of FIG. 1.

DETAILED DESCRIPTION OF THE EMBODIMENTS

Figure 1:
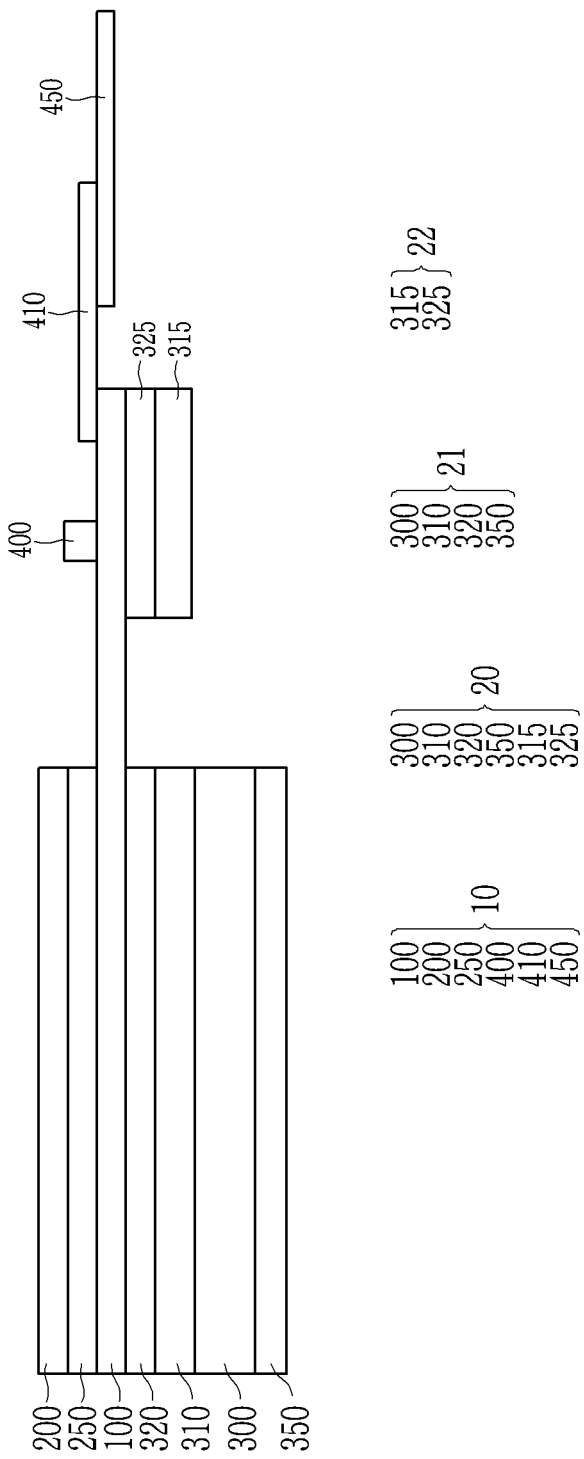
FIG. 1 is a cross-sectional view of a flexible display device according to an exemplary embodiment.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

In order to clearly explain the present inventive concept, portions that are not directly related to the present inventive concept are omitted, and the same reference numerals are attached to the same or similar constituent elements throughout the entire specification.

In addition, the size and thickness of each configuration shown in the drawings are arbitrarily shown for better understanding and ease of description, but the present inventive concept is not limited thereto. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in this specification, the phrase "on a plane" means viewing a target portion from the top, and the phrase "on a cross-section" means viewing a cross-section formed by vertically cutting a target portion from the side.

Now, a flexible display device according to an exemplary embodiment will be described with reference to FIG. 1.

FIG. 1 is a cross-sectional view of a flexible display device according to an exemplary embodiment.

The flexible display device according to an exemplary embodiment includes a display panel part 10 including a display panel 100 and a base film part 20 including a base film 300.

The display panel part 10 includes the display panel 100 and constituent elements disposed thereon as shown in FIG. 1. That is, the display panel part includes the display panel 100, a polarizer 250, a touch panel 200, a signal control chip 400, a flexible printed circuit substrate (FPCB) 410, and a printed circuit board (PCB) 450.

The display panel 100 may use a flexible organic light emitting panel in which an organic light emitting element is formed on a substrate such as plastic. The organic light emitting panel has a merit that display luminance does not change even when the display panel is bent to be suitable for use with the flexible display device. However, the display panel 100 according to the present exemplary embodiment is not limited to the organic light emitting panel.

The display panel 100 includes a display area displaying an image and a driving area on which the signal control chip 400 is disposed.

Firstly, the display area of the display panel 100 will be described.

The touch panel 200 is disposed on the display area of the display panel 100, and the polarizer 250 is disposed between the touch panel 200 and the display panel 100.

The touch panel 200 is an input device capable of executing an input through a touch of the image displayed on the display panel 100. That is, the touch panel 200 senses the position where the touch is executed so that the flexible display device may execute an operation thereof.

On the other hand, the polarizer 250 improves a characteristic of light emitted from the display panel 100, thereby playing a role for easily recognizing the image provided from the display panel 100. Also, it is possible to reduce interference between the display panel 100 and the touch panel 200.

According to an exemplary embodiment, the positions of the polarizer 250 and the touch panel 200 may be exchanged with each other such that the polarizer 250 may be disposed on the touch panel 200.

Also, according to an exemplary embodiment, it is possible to not only display the image but also to have a structure that allows touch sensing while the display panel 100 has one panel structure. In this case, the polarizer 250 may be omitted.

The touch panel 200, the polarizer 250, and the display panel 100 may be attached to each other by an adhesive layer (not shown).

Further, the signal control chip 400 is mounted on the driving area of the display panel 100. The signal control chip 400 is electrically connected to each pixel of the display panel 100. Each pixel is controlled by a signal provided from the signal control chip 400, thereby emitting light of a predetermined luminance. An alignment key (referring to FIG. 6) is formed on the flexible substrate to help alignment of the signal control chip 400 to the flexible substrate of the display panel 100 when mounting the signal control chip 400. Thus, the signal control chip 400 can be mounted on the display panel 100 without a misalignment.

The flexible printed circuit substrate 410 is attached outside the driving area of the display panel 100. Wiring is formed in the flexible printed circuit substrate 410, and the corresponding wiring is connected to the signal control chip 400.

The main printed circuit board (PCB) 450 is attached outside the flexible printed circuit substrate 410. The wiring may be formed in the main printed circuit board (PCB) 450, and the main printed circuit board (PCB) 450 may include a main controller that is mounted in a chip form. The main controller executes the entire control of the electronic device included in the display device, and transmits data to be displayed on the display device to the signal control chip 400. The data provided from the main controller is transmitted to the signal control chip 400 through the wiring formed in the main printed circuit board (PCB) 450 and the flexible printed circuit substrate 410 and the wiring formed in the driving area of the display panel 100. The main printed circuit board (PCB) 450 may be formed of a flexible material such as the flexible printed circuit substrate 410 or may be formed of a rigid material.

A layer protecting the display panel part 10 such as a window may be further attached on the display panel part 10.

Next, the base film part 20 attached under the display panel part 10 and having a sheet shape will be described.

The base film part 20 includes constituent elements disposed under the display panel 100, and is divided into two parts as shown in FIG. 1. That is, the base film part 20 includes a first base film part 21 disposed under the display area of the display panel 100 and a second base film part 22 disposed under the driving area of the display panel 100.

First, the structure of the first base film part 21 will be described.

The first base film part 21 includes the base film 300, a film layer 310, an adhesive layer 320, and a pressure sensor layer 350.

When the display panel part 10 is bent, because the display panel part 10 may receive an elastic restoring force, the base film 300 which includes the metal layer to be fixed at the corresponding position is required. The metal layer is formed of a metal such as aluminum (Al), and the metal layer may be a solid metal layer or may include a metal pattern. The base film 300 may include an adhesive layer (not shown) covering the upper part or the lower part of the metal layer. The adhesive layer may include a pressure sensitive adhesive (PSA).

The film layer 310 is disposed between the base film 300 and the display panel 100, and may be a cushion between the lower surface of the display panel 100 and the base film 300. The film layer 310 may be formed of polyethylene terephthalate (PET).

Figure 14:
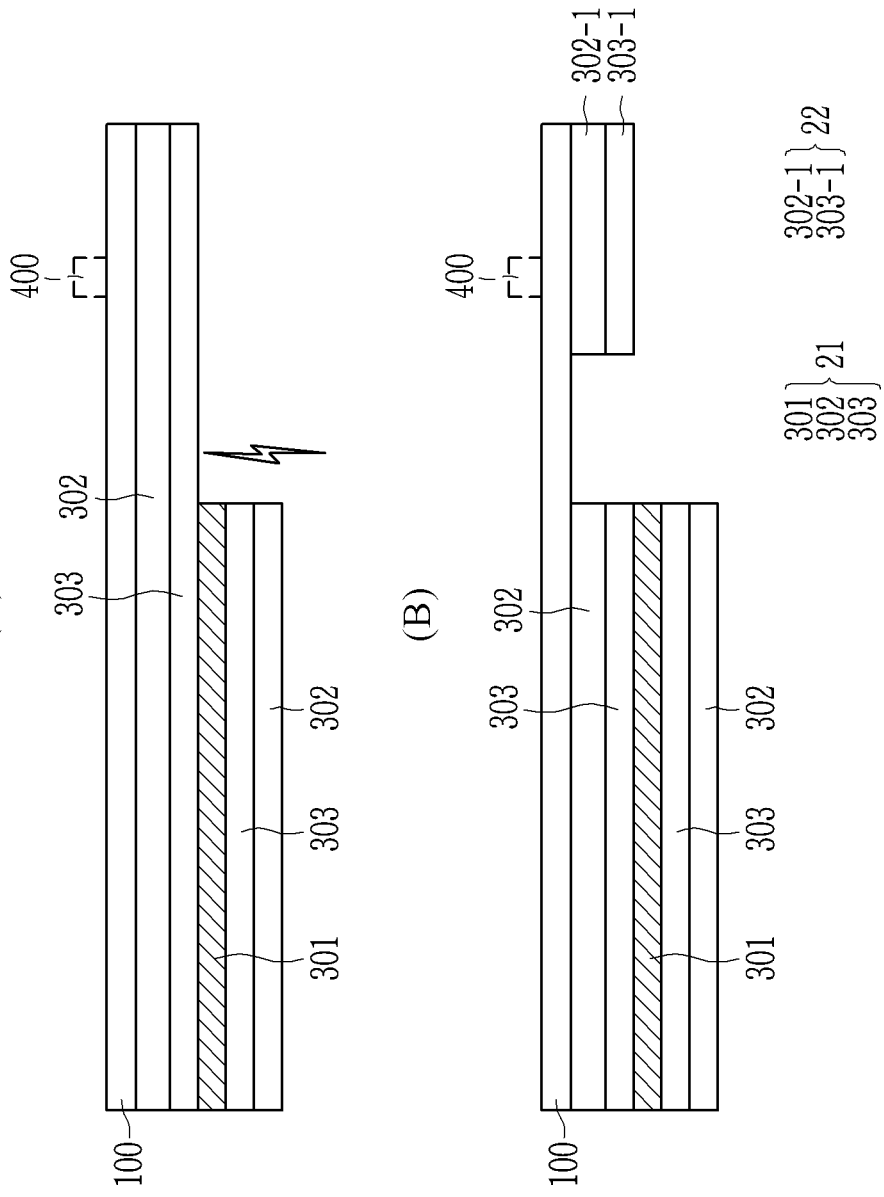
FIG. 14 is a view showing a manufacturing method of a flexible display device according to an exemplary embodiment.
Figure 15:
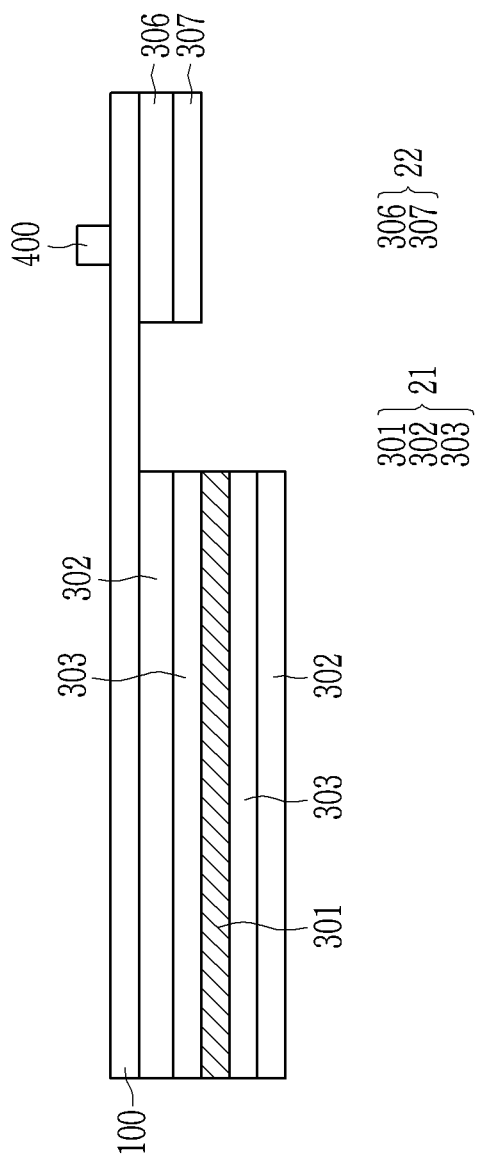
FIG. 15 is a cross-sectional view of a flexible display device according to another exemplary embodiment.

According to an exemplary embodiment, the film layer 310 may be omitted. The film layer 310 performs a role of supporting the base film 300, and the film layer 310 may be omitted in a structure that is supported only by the base film 300. The structure omitting the film layer 310 is shown in FIG. 14 and FIG. 15.

The adhesive layer 320 is disposed on the film layer 310, and the display panel 100 and the film layer 310 are attached by the adhesive layer 320. The adhesive layer 320 may be formed of a strong adhesive material so that the film layer 310 and the display panel 100 are not separated from each other.

The film layer 310 and the base film 300 may also be attached by the adhesive layer.

In the present exemplary embodiment, the pressure sensor layer 350 is included under the base film 300. The pressure sensor layer 350 may be omitted according to an exemplary embodiment, and if the display device is pressed, the pressure is sensed such that the display device may change the image to be displayed.

Next, the second base film part 22 disposed under the driving area of the display panel 100 will be described.

An external film layer 315 as the base film part 20 is disposed under the driving area of the display panel 100. The external film layer 315 is formed of the same material as the film layer 310 disposed under the display area of the display panel 100. According to an exemplary embodiment, the external film layer 315 may be formed of PET (polyethylene terephthalate).

The external film layer 315 is attached to the lower surface of the driving area of the display panel 100 by an external adhesive layer 325. The external adhesive layer 325 is also formed of the same material as the adhesive layer 320 disposed under the display area of the display panel 100. According to an exemplary embodiment, the external adhesive layer 325 may be formed of a strong adhesive material so that the external film layer 315 and the display panel 100 do not separate from each other.

When comparing the first base film part 21 and the second base film part 22, in the exemplary embodiment of FIG. 1, the second base film part 22 has a structure in which the base film 300 and the underlying layers are not included and the layer disposed on the base film 300 is equally included. That is, the first base film 21 and the second base film 22 may have layers corresponding to each other and some layers may not correspond to each other. In an exemplary embodiment of FIG. 1, the adhesive layer 320 and the external adhesive layer 325, and the film layer 310 and the external film layer 315 are layers corresponding to each other, and the base film 300 and the pressure sensor layer 350 are layers that do not correspond to each other. Also, in the exemplary embodiment of FIG. 1, the corresponding layers are formed of the same material.

The second base film part 22 is only formed of the transparent layer. That is, the base film 300 including the metal layer is not included in the second base film part 22, such that the signal control chip 400 and the alignment key can be recognized at the top when viewing the display panel 100 below the external film layer 315. That is, the signal control chip 400 may be easily aligned when mounting the signal control chip 400 on the display panel 400 even when the alignment key is recognized at the bottom. On the other hand, if the second base film part 22 disposed under the driving area of the display panel 100 includes the metal base film 300, the alignment key may not be recognized such that a misalignment of the signal control chip 400 may occur. Therefore, in the present inventive concept, the second base film part 22 is formed to be transparent without including an opaque material line the metal layer such that there is a merit of being capable of recognizing the alignment key at the bottom even if the second base film part 22 is adhered.

Also, as the second base film part 22 is formed to be transparent, after adhering the flexible printed circuit substrate 410 to the display panel 100 by using an anisotropic conductive film (ACF), it is also possible to check whether there is a problem with the adhesion of the flexible printed circuit substrate 410 by checking notches of the anisotropic conductive film.

In the above-described exemplary embodiment of FIG. 1, an adhesive layer may be additionally formed between the layers to adhere each layer, and in this case, the adhesive layer used may be a pressure sensitive adhesive (PSA).

On the other hand, a bending area is disposed at the part where the signal control chip 400 is not disposed within the driving area of the display panel 100. The flexible display device shown in FIG. 1 is folded in the bending area, thereby having the structure as shown in FIG. 2.

Figure 2:
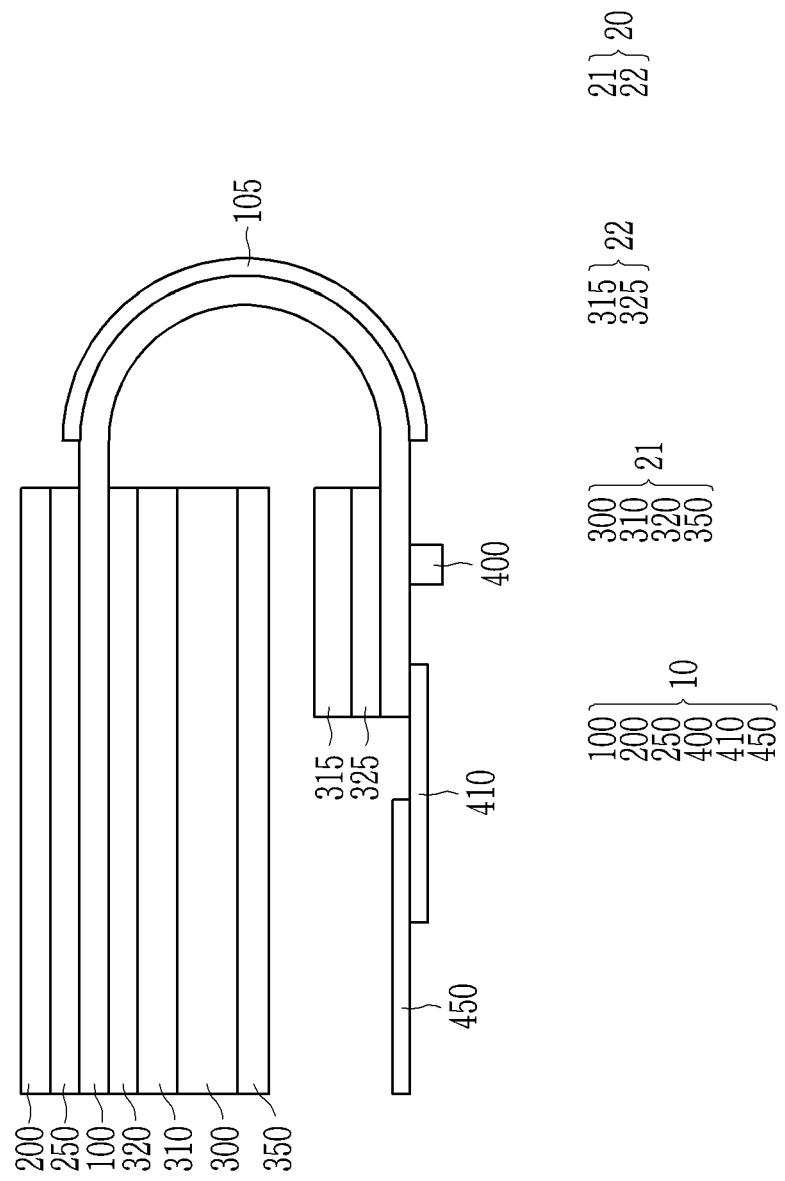
FIG. 2 is a view showing a structure in which the flexible display device of FIG. 1 is folded.

FIG. 2 is a view showing the structure of folding the flexible display device of FIG. 1.

FIG. 2 shows the structure in which the display panel 100 is folded in the bending area disposed between the display area and the driving area of the display panel 100. The bending area is an area that is disposed in the driving area of the display panel 100 and disposed between the signal control chip 400 and the display area among the driving area.

If the display panel 100 is folded in the bending area, the driving area of the display panel 100 is disposed under the display area of the display panel 100 such that an area occupied by the display panel 100 in a plan view may be reduced. As a result, an electronic device including the flexible display device may also have a small area. As shown in FIG. 2, the folded structure is formed after mounting the signal control chip 400 using the alignment key.

Next, in the folded structure as shown in FIG. 2, the flexible display device may be folded based on one axis (referring to a folding axis of FIG. 5) or more existing in the display area. In this case, the metal layer of the base film 300 supports the folded structure not to be unfolded again.

Referring to FIG. 2, differently from FIG. 1, a crack preventing layer 105 is additionally formed at the part (i.e., the bending area) that is folded into the upper surface of the display panel 100. The crack preventing layer 105 may be omitted according to an exemplary embodiment, and is a layer to protect the wiring disposed on the bending area not to be disconnected. The crack preventing layer 105 may be formed by coating and curing a resin that is cured by ultraviolet rays.

The flexible display device is manufactured by a method of respectively manufacturing the display panel part 10 and the base film part 20 and adhering them.

Next, the step of manufacturing the flexible display device as shown in FIG. 1 is described with reference to FIG. 3 and FIG. 4.

First, the method of manufacturing the display panel part 10 is described through FIG. 3.

FIG. 3 is a view showing the step of manufacturing the display panel part of the flexible display device of FIG. 1.

First, FIG. 3 (A) is described.

A display panel part module for manufacturing the display panel part 10 includes the display panel 100, a release film layer 340 for protecting the display panel 100 up and down, and a weak adhesive layer 330 adhering the release film layer 340 and the display panel 100.

The release film layer 340 adhered to both sides of the display panel 100 may be formed of polyethylene terephthalate (PET). The release film layer 340 protects the display panel 100 not to be damaged in the process of manufacturing the display panel 100, and is not actually included in the display device and the display panel part 10.

The display panel 100 and two release film layers 340 are adhered by the weak adhesive layer 330. The reason for using the weak adhesive layer 330 is that the release film layer 340 has to be removed. Therefore, the weak adhesive layer 330 has weak adhesion such that it may be easily detached, and the adhesive having weak adhesive strength among the pressure sensitive adhesive may be used.

FIG. 3 (B) shows that the release film layer 340 disposed under the display panel 100 is removed. This shows the step directly before adhering the base film part 20 under the display panel 100.

FIG. 3 (B) also shows a state that the release film layer 340 disposed on the top is attached. However, the release film layer 340 located at the top will also be removed, and referring to FIG. 1, the touch panel 200 and the polarizer 250 are attached at the place where the release film layer 340 disposed on the top is removed.

According to an exemplary embodiment, the adhesion of the touch panel 200 and the polarizer 250 may be performed before the adhesion of the base film part 20.

Next, the method for manufacturing the base film part 20 is described through FIG. 4.

FIG. 4 is the view showing the step of manufacturing the base film part of the flexible display device of FIG. 1.

First, FIG. 4 (A) is described.

The base film part module for the manufacturing of the base film part 20 has a structure in which the first base film part 21 and the second base film part 22 are connected by release film layers 340 and 341.

The base film part module has a structure in which the upper and lower release film layers 340 and 341 are further adhered to the first and second base film parts 21 and 22.

The upper release film layer 340 protects the base film part 20 until the base film part 20 is attached to the display panel part 10. Although not shown, the weak adhesive layer may be further included between the upper release film layer 340 and the base film part 20.

On the other hand, the lower release film layer 341 is attached to the first base film part 21 and the second base film part 22 by weak adhesive layers 330 and 330-1. The lower release film layer 341 has a function of preventing the first base film part 21 and the second base film part 22 from being separated when the base film part 20 is attached to the display panel part 10 and is removed after the first base film part 21 and the second base film part 22 are attached to the display panel part 10.

The first base film part 21 and the second base film part 22 have a step such that the weak adhesive layer 330-1 attached to the second base film part 22 may be formed thicker than the weak adhesive layer 330 attached to the first base film part 21. If the step is large, a transparent film may be additionally formed to reduce the step under the second base film part 22.

The first base film part 21 is disposed under the display area of the display panel 100 after the adhesion, and the second base film part 22 is disposed under the driving area of the display panel 100 after the adhesion.

The structure of the first base film part 21 and the second base film part 22 is the same as in FIG. 1, and additional description thereof is omitted.

Referring to FIG. 4 (B), the base film part module is adhered to the display panel part module after the upper release film layer 340 is removed.

The first base film part 21 and the second base film part 22 are separated from each other such that the lower release film layer 341 fixes the two base film parts 21 and 22 not to be separated even though the upper release film layer 340 is removed. The lower release film layer 341 is removed after the first base film part 21 and the second base film part 22 are attached to the display panel part 10.

Since the second base film part 22 does not include the metal layer and is formed to be transparent, the alignment key disposed on the top of the display panel 100 may be recognized when viewed from the bottom such that the alignment of the signal control chip 400 is possible, and it is possible to check notches of the anisotropic conductive film (ACF) used when attaching the flexible printed circuit substrate 410 to the display panel 100 at the bottom of the display panel 100.

Figure 5:
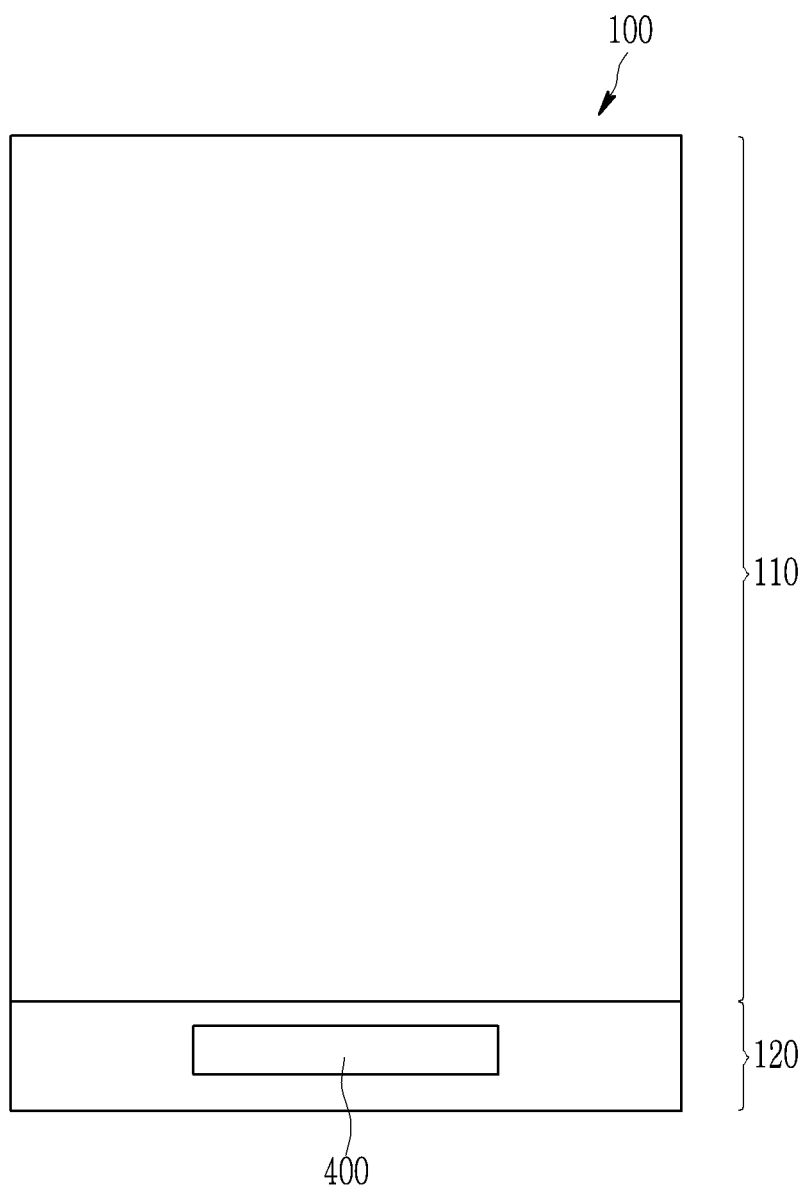
FIG. 5 is a top plan view of a flexible display panel according to an exemplary embodiment of FIG. 1.

Next, the display area and the driving area are separately described based on the display panel 100 through FIG. 5.

FIG. 5 is a top plan view of the flexible display panel according to an exemplary embodiment of FIG. 1.

The display panel 100 includes a display area 110 and a driving area 120.

The display area 110 includes a pixel displaying an image, and an organic light emitting diode element is formed in each pixel, thereby emitting light depending on a current flowing through the organic light emitting diode.

The display panel 100 is formed of a substrate such as a flexible plastic, and accordingly any part in the display area 110 may be folded by having the flexible characteristic. However, according to an exemplary embodiment, the display area 110 may be manufactured to have the folded structure based on a specific position.

On the other hand, the driving area 120 is disposed outside the display area.

The driving area 120 includes the signal control chip 400 applying the control signal to the pixel of the display area 110 and wiring (not shown) to apply the signals to each pixel.

Also, in the driving area 120, the bending area is disposed between the signal control chip 400 and the display area 110. There are no separate layers to be attached above and below the bending area, and the bending area may be folded as shown in FIG. 2.

Figure 6:
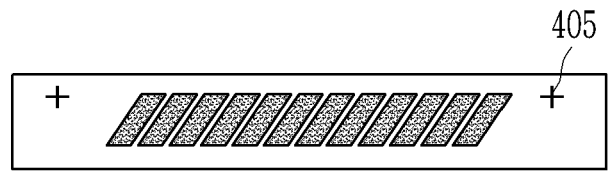
FIG. 6 is an enlarged view showing an alignment key among the flexible display device of FIG. 5.

Also, in the driving area 120, the alignment key 405 is formed at the part where the signal control chip 400 is mounted, and this is shown in FIG. 6.

FIG. 6 is an enlarged view showing the alignment key of the flexible display device of FIG. 5.

As shown in FIG. 6, the alignment key 405 having a cross shape is formed near the position where the signal control chip 400 is mounted among the driving area 120 of the display panel 100. As shown in FIG. 6, the alignment key 405 may be disposed within the region where the signal control chip 400 is disposed, or may be disposed near the region where the signal control chip 400 is disposed.

If the signal control chip 400 overlaps the display panel 100 to be mounted, the alignment key 405 is covered. Thus, while seeing the alignment key 405 below the display panel 100, the signal control chip 400 may be mounted. When considering this point, although the base film 300 including the metal is used in the flexible display device, the second base film part 22 disposed under the driving area 120 of the display panel 100 has the transparent structure.

Next, the structure of the base film part module according to another exemplary embodiment is described.

Figure 7:
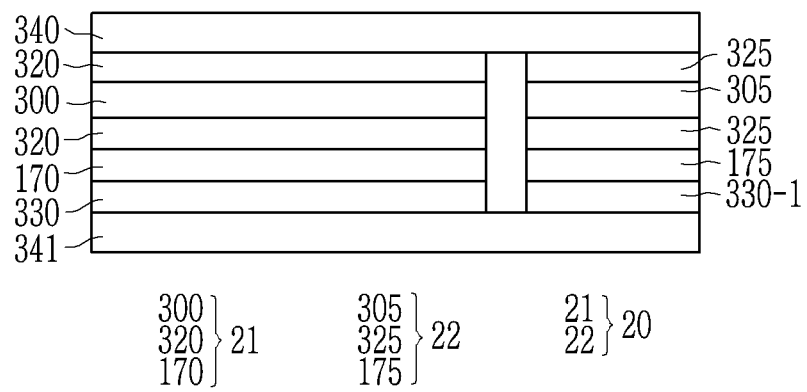
FIG. 7 is a cross-sectional view of a base film part module according to another exemplary embodiment.

FIG. 7 is a cross-sectional view of a base film part module according to another exemplary embodiment.

The base film part according to an exemplary embodiment of FIG. 7 further includes a cushion layer 170, differently from an exemplary embodiment of FIG. 4, and the pressure sensor layer is not included.

The base film part module according to an exemplary embodiment of FIG. 7 has the structure in which the release film layers 340 and 341 are attached to the first and second base films part 21 and 22.

The base film part module for manufacturing the base film part 20 has the structure in which the first base film part 21 and the second base film part 22 are connected by the upper release film layer 340 and the lower release film layer 341.

The release film layers 340 and 341 protect the base film part 20 before the base film part 20 is attached to the display panel part 10. Also, the lower release film layer 341 performs the function of preventing the first and second base film parts 21 and 22 from being separated in the state that the upper release film layer 340 is removed.

The first base film part 21 is disposed below the display area of the display panel 100 after the attachment, and the second base film part 22 is disposed below the driving area of the display panel 100 after attachment.

The first base film part 21 includes the base film 300, the adhesive layer 320, and the cushion layer 170.

The base film 300 includes the metal layer, and the metal layer may be formed of a metal such as aluminum (Al). The metal layer is made of a solid metal layer or a layer including a metal pattern.

The cushion layer 170 is disposed under the base film 300. The cushion layer 170 may be formed of the transparent insulating material having elasticity, and has a function of alleviating an impact provided under the display device. In an exemplary embodiment of FIG. 7, the cushion layer 170 is also formed of the transparent material.

An adhesive layer 320 is respectively disposed between the base film 300 and the cushion layer 170 and on the base film 300. The adhesive layer 320 may be formed of the strong adhesive material so that the film layer 310 and the display panel 100 are not separated from each other. The adhesive material may use a pressure sensitive adhesive (PSA).

On the other hand, the weak adhesive layer 330 is disposed between the cushion layer 170 and the lower release film layer 341 such that the lower release film layer 341 may be easily removed.

On the other hand, the second base film part 22 includes an external base film 305, an external cushion layer 175, and the external adhesive layer 325 disposed therebetween or outside.

The external base film 305 does not include the metal layer, differently from the base film 300. That is, the external base film 305 has the transparent characteristic and is formed of the transparent insulating material. The structure of the external base film 305 is described later in FIG. 10 to FIG. 13.

The external cushion layer 175 is made of the same material as the cushion layer 170 disposed under the display area of the display panel 100, that is, the transparent insulating material having the elasticity.

The external adhesive layer 325 is also formed of the same material as the adhesive layer 320 disposed under the display area of the display panel 100. According to an exemplary embodiment, the external adhesive layer 325 may be formed of the strong adhesive material not to be separated after the external cushion layer 175 and the external base film 305 are attached to the display panel 100. The adhesive material may use a pressure sensitive adhesive (PSA).

On the other hand, the weak adhesive layer 330-1 is disposed between the external cushion layer 175 and the lower release film layer 341, thereby the lower release film layer 341 is easily removed.

The first base film part 21 and the second base film part 22, having the above-described structure, are connected by the release film layers 340 and 341 to form the base film part module.

The base film part module shown in FIG. 7 is also attached under the display panel part after the upper release film layer 340 is removed as shown in FIG. 4. In this case, the lower release film layer 341 has the function of preventing the first base film part 21 and the second base film part 22 from being separated. After the first base film part 21 and the second base film part 22 are attached under the display panel part, the lower release film layer 341 is removed.

The second base film part 22 includes the external base film 305 that is formed to be transparent and the external cushion layer 175 that is formed of the transparent material, thereby being entirely transparent. As a result, the alignment key disposed on the top of the display panel 100 may be recognized when viewed from the bottom such that the alignment of the signal control chip 400 is possible, and it is possible to check notches of the anisotropic conductive film (ACF) used when attaching the flexible printed circuit substrate 410 to the display panel 100 at the bottom of the display panel 100.

Next, the structure of the base film part module according to another exemplary embodiment is described with reference to FIG. 8.

Figure 8:
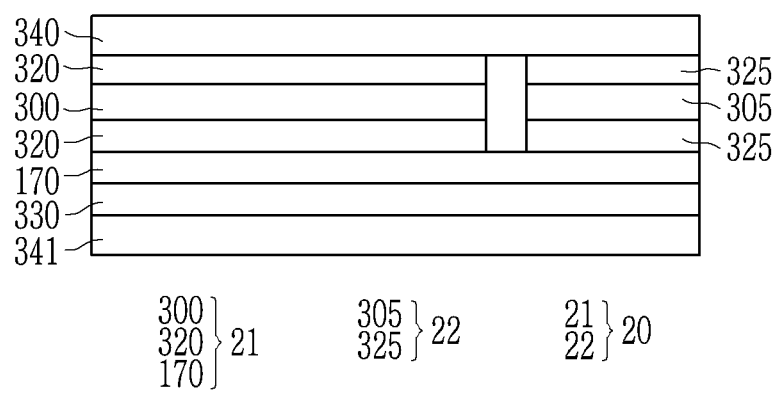
FIG. 8 is a cross-sectional view of a base film part module according to another exemplary embodiment.

FIG. 8 is a cross-sectional view of a base film part module according to another exemplary embodiment.

As shown in FIG. 8, differently from the base film part module of FIG. 7, the cushion layer 170 has a structure that extends to the bottom of the second base film part 22.

The base film part module according to an exemplary embodiment of FIG. 8 has a structure in which the release film layers 340 and 341 are further attached above and below the first and second base film parts 21 and 22. The release film layers 340 and 341 protect the top and the bottom of the base film part 20 until the base film part 20 is attached to the display panel part 10. Also, the lower release film layer 341 performs the function of preventing the first and second base film parts 21 and 22 from being separated from each other when the upper release film layer 340 is removed.

In an exemplary embodiment of FIG. 8, the cushion layer 170 may also be formed of the transparent insulating material having elasticity and has a function of alleviating the impact provided below the display device.

An exemplary embodiment of FIG. 8 is described as follows.

The base film part module for manufacturing the base film part 20 has a structure in which the first base film part 21 and the second base film part 22 are connected by the release film layers 340 and 341 and the cushion layer 170 disposed on the top and the bottom.

The first base film part 21 is disposed below the display area of the display panel 100 after the adhesion, and the second base film part 22 is disposed below the driving area of the display panel 100 after the adhesion.

The first base film part 21 includes the base film 300, the adhesive layer 320, and the cushion layer 170.

The base film 300 include the metal layer, and the metal layer may be formed of the metal such as aluminum (Al). The metal layer is made of a solid metal layer or a layer including a metal pattern.

The cushion layer 170 is disposed under the base film 300. The cushion layer 170 may be formed of the transparent insulating material having the elasticity and has a function of alleviating an impact provided under the display device. Also, the cushion layer 170 extends to a bottom of the second base film 22.

The adhesive layer 320 is respectively disposed between the base film 300 and the cushion layer 170 and on the base film 300. The adhesive layer 320 may be formed of the strong adhesive material so that the film layer 310 and the display panel 100 are not separated from each other. The adhesive material may use a pressure sensitive adhesive (PSA).

The lower release film layer 341 is attached under the cushion layer 170. The lower release film layer 341 also extends to the bottom of the second base film 22 like the cushion layer 170. The weak adhesive layer 330 attaching the lower release film layer 341 and the cushion layer 170 also extends to the bottom of the second base film 22.

The weak adhesive layer 330 disposed between the cushion layer 170 and the lower release film layer 341 facilitates the removal of the lower release film layer 341.

On the other hand, the second base film part 22 includes the external base film 305 and the external adhesive layer 325.

The external base film 305 does not include the metal layer, differently from the base film 300. That is, the external base film 305 has the transparent characteristic and is formed of the transparent insulating material. The structure of the external base film 305 is described later in FIG. 10 to FIG. 13.

The external adhesive layer 325 is disposed on the top and the bottom of the external base film 305, and is formed of the same material as the adhesive layer 320 disposed in the first base film part 21. According to an exemplary embodiment, the external adhesive layer 325 may be formed of the strong adhesive material not to be separated after the external base film 305 is attached to the display panel 100. The adhesive material may use a pressure sensitive adhesive (PSA).

The first base film part 21 and the second base film part 22, having the above-described structures, are connected by the release film layers 340 to from the base film part module.

The base film part module is attached at the bottom of the display panel part after the upper release film layer 340 is removed, thereby the first base film part 21 is disposed on the bottom of the display area and the second base film part 22 is disposed on the bottom of the driving area.

In an exemplary embodiment of FIG. 8, the cushion layer 170 and the lower release film layer 341 prevent the first base film part 21 and the second base film part 22 from being separated from each other.

The lower release film layer 341 may be removed after the base film part 20 is attached to the display panel part 10.

Since the second base film part 22 is transparent, the alignment key disposed on the top of the display panel 100 may be recognized when viewed from the bottom such that the alignment of the signal control chip 400 is possible, and it is possible to check notches of the anisotropic conductive film (ACF) used when attaching the flexible printed circuit substrate 410 to the display panel 100 at the bottom of the display panel 100.

Next, the entire cross-sectional structure of the flexible display device according to an exemplary embodiment will be described with reference to FIG. 9.

Figure 9:
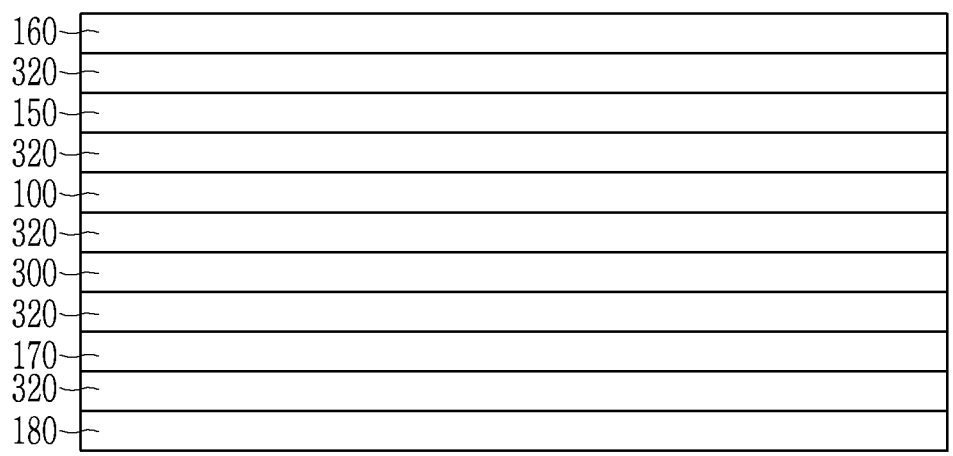
FIG. 9 is a cross-sectional view of a flexible display device according to an exemplary embodiment.

FIG. 9 is a cross-sectional view of a flexible display device according to an exemplary embodiment.

The flexible display device may have various layers, its structure differs from the structure described so far, and it may have a structure like the cross-section of FIG. 9.

FIG. 9 only shows the layered relationship of upper and lower portions of the display area of the display panel 100.

The flexible display device according to an exemplary embodiment of FIG. 9 includes the display panel 100, the base film 300, the cushion layer 170, a housing 180, a window 150, and a protection film 160. Also, the adhesive layer 320 is disposed between the layers.

The flexible display device according to an exemplary embodiment includes the display panel part including the display panel 100, and the base film part disposed on the bottom of the display panel 100 and including the base film 300.

The display panel part includes the display panel 100 and constituent elements disposed thereon, and includes the display panel 100, the window 150, and the protection film 160, and the adhesive layers 320 disposed therebetween.

On the other hand, the base film part includes constituent elements disposed on the bottom of the display panel 100, and includes the base film 300, the cushion layer 170, and the housing 180, and the adhesive layers 320 disposed therebetween. The adhesive layer 320 disposed between the base film 300 and the display panel 100 is also included in the base film part. The base film part is referred to as a base sheet and is attached at the bottom of the display panel part when manufacturing the flexible display device, and has a function of fixing the display device when bending the display device.

First, the display panel part is described.

The display panel 100 may use the flexible organic light emitting panel in which the organic light emitting element is formed on the substrate to be bendable, such as plastic, etc. The organic light emitting panel has the merit that the display luminance is not changed even if the display panel is bent, thereby being appropriate to be used for the flexible display device. However, the display panel 100 according to the present exemplary embodiment is not limited to the organic light emitting panel. The display panel 100 may have a touch sensing function according to an exemplary embodiment.

The window 150 is disposed on the display area of the display panel 100 and the protection film 160 is disposed on the window 150. The display panel 100, the window 150, and the protection film 160 are adhered by the adhesive layers 320.

On the other hand, the signal control chip is mounted on one side of the display panel 100, and the flexible printed circuit substrate is adhered outside the display panel 100. The main printed circuit board (PCB) may be attached outside the flexible printed circuit substrate.

Hereinafter, the base film part attached under the display panel part and having a sheet shape is described.

The base film part includes the base film 300, the cushion layer 170, the housing 180, and the adhesive layer 320.

The base film 300 includes the metal layer such that the display panel part 10 may be fixed at the corresponding position when the display panel part 10 receives an elastic restoring force. The metal layer is formed of the metal such as aluminum (Al), and may be a solid metal layer or a layer including the metal pattern.

The cushion layer 170 is disposed under the base film 300, and performs the function of protecting the display panel 100 from the impact applied from the bottom. The cushion layer 170 may be formed of the insulating material having elasticity such as a film or a sponge. The cushion layer is formed of the transparent material when the cushion layer is disposed under the driving area of the display panel 100.

The housing 180 is disposed under the cushion layer 170. The housing 180 encloses the display panel 100 along with the window 150, and has a function of protecting the display panel 100 from the outside.

The base film 300, the cushion layer 170, and the housing 180 are attached to each other by the adhesive layers 320. Also, the adhesive layer 320 is disposed on the base film 300 to be attached to the bottom of the display panel 100.

The adhesive layer 320 may be formed of the strong adhesive material so that the adjacent layers are not separated from each other. The adhesive material may use a pressure sensitive adhesive (PSA).

In the above, the base film part (the first base film part) disposed under the display area of the display panel 100 was described.

The second base film part disposed under the driving area of the display panel 100 has a structure including at least one layer of the first base film part. The other layers may be variously changed. That is, among the layers disposed under the display panel 100 in FIG. 9, the partial layer may also be separated and formed under the driving area, and the rest of the layers may not be formed under the driving area. However, the layer disposed under the driving area has the transparent characteristic.

Next, the structure of the various base films 300 according to an exemplary embodiment will be described with reference to FIG. 10 to FIG. 13. The base film 300 according to an exemplary embodiment of FIG. 10 to FIG. 13 is in the state before the base film 300 and the external base film 305 are divided, differently from the exemplary embodiment of FIG. 7.

Hereinafter, the first base film region in which the base film 300 is disposed and the second base film region in which the external base film 305 is disposed are separately described.

Figure 10:
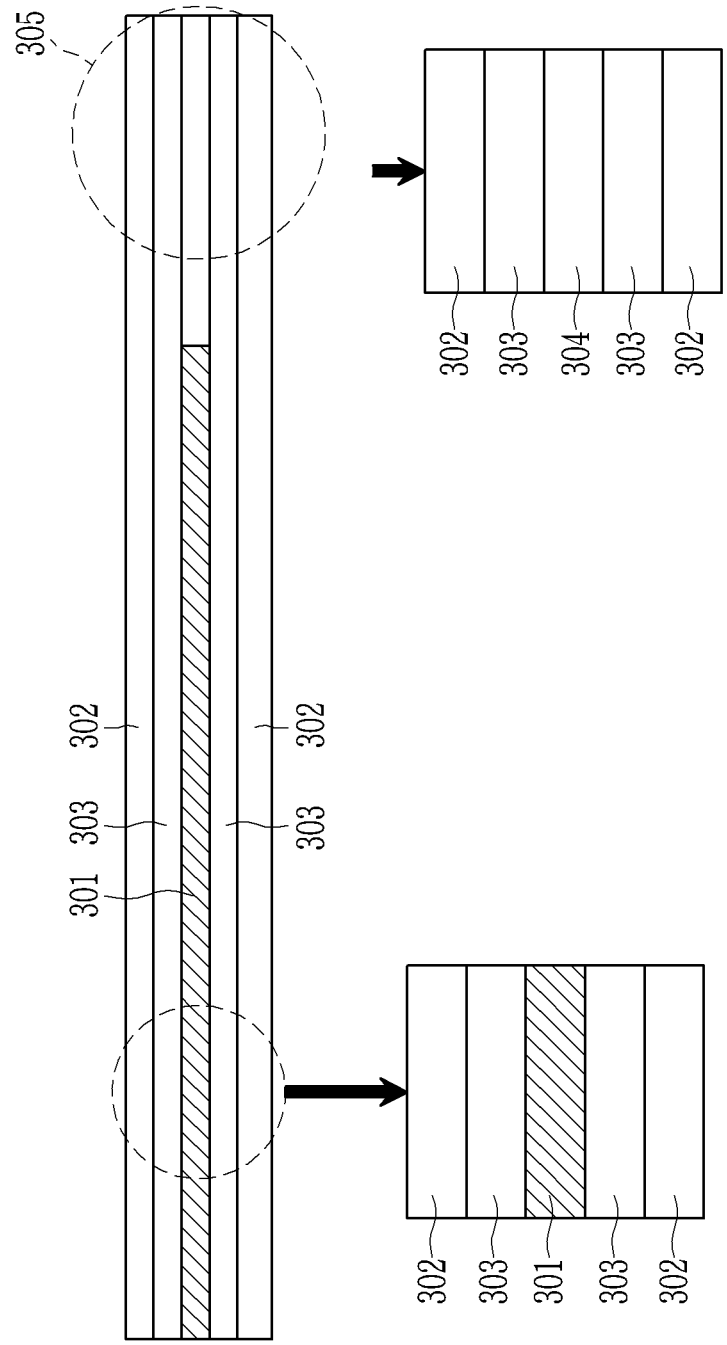
FIG. 10 is a cross-sectional view of a base film according to an exemplary embodiment.

First, FIG. 10 is described.

FIG. 10 is the cross-sectional view of the base film according to an exemplary embodiment.

A metal layer 301 is disposed in the first base film region, a metal layer 301 is not disposed in the second base film region, and a transparent layer 304 is disposed instead of the metal layer 301 in the second base film region. The first base film region and the second base film are connected to each other, but are separated from each other before or after the adhesion on the lower surface of the display panel 100.

The base film 300 according to the exemplary embodiment of FIG. 10 is configured of a total of five layers.

In the first base film region, a first coating layer 302 and a second coating layer 303 are respectively disposed above and below the metal layer 301.

That is, the metal layer 301 is formed of the metal such as aluminum (Al), and may be a solid metal layer or a layer including a metal pattern according to an exemplary embodiment. The metal layer has a function of fixing the display device in some cases in which the display device tends to again return to the original state when bending and folding the display device.

The second coating layer 303 is disposed on the metal layer 301 and the first coating layer 302 is disposed thereon. On the other hand, the second coating layer 303 is disposed under the metal layer 301, and the first coating layer 302 is disposed thereunder.

The first coating layer 302 and the second coating layer 303 are formed of the transparent material such as a polyimide. In the present exemplary embodiment, the first coating layer 302 uses PI-H (Kapton® polyimide film), and the second coating layer 303 uses TPI (thermoplastic polyimide).

However, according to an exemplary embodiment, only one coating layer may be disposed above or below the metal layer 301. When forming one coating layer, the coating layer may be formed by using polyimide-series materials.

On the other hand, the second base film region is also configured of five layers. The second base film region is separated from the first base film region in the following process, and forms the external base film 305.

In the second base film region, like the first base film region, the first coating layer 302 and the second coating layer 303 are attached as a pair to both sides, and the transparent layer 304 is disposed at the center. The transparent layer 304 is the layer corresponding to the metal layer 301 of the first base film region. That is, the second base film region does not include the metal layer 301 and includes the transparent layer 304 instead. The transparent layer 304 is formed of the transparent insulating material, and may use an optically clear resin (OCR), an optically clear adhesive (OCA), or a pressure sensitive adhesive (PSA).

The second coating layer 303 is disposed on the transparent layer 304, and the first coating layer 302 is disposed thereon. On the other hand, the second coating layer 303 is disposed under the transparent layer 304 and the first coating layer 302 is disposed thereunder.

The first coating layer 302 and the second coating layer 303 are formed of the transparent material such as a polyimide. In the present exemplary embodiment, the first coating layer 302 uses PI-H (Kapton® polyimide film), and the second coating layer 303 uses TPI (thermoplastic polyimide).

However, according to an exemplary embodiment, only one coating layer may be disposed above or below the transparent layer 304, and when forming one coating layer, the coating layer may be formed by using polyimide-series materials.

As shown in FIG. 10, the first base film region and the second base film region are connected and then separated to form the base film 300 and the external base film 305. Next, they are attached to the rear surface of the display panel 100.

Next, the base film according to various exemplary embodiments is described with reference to FIG. 11 to FIG. 13.

Figure 11:
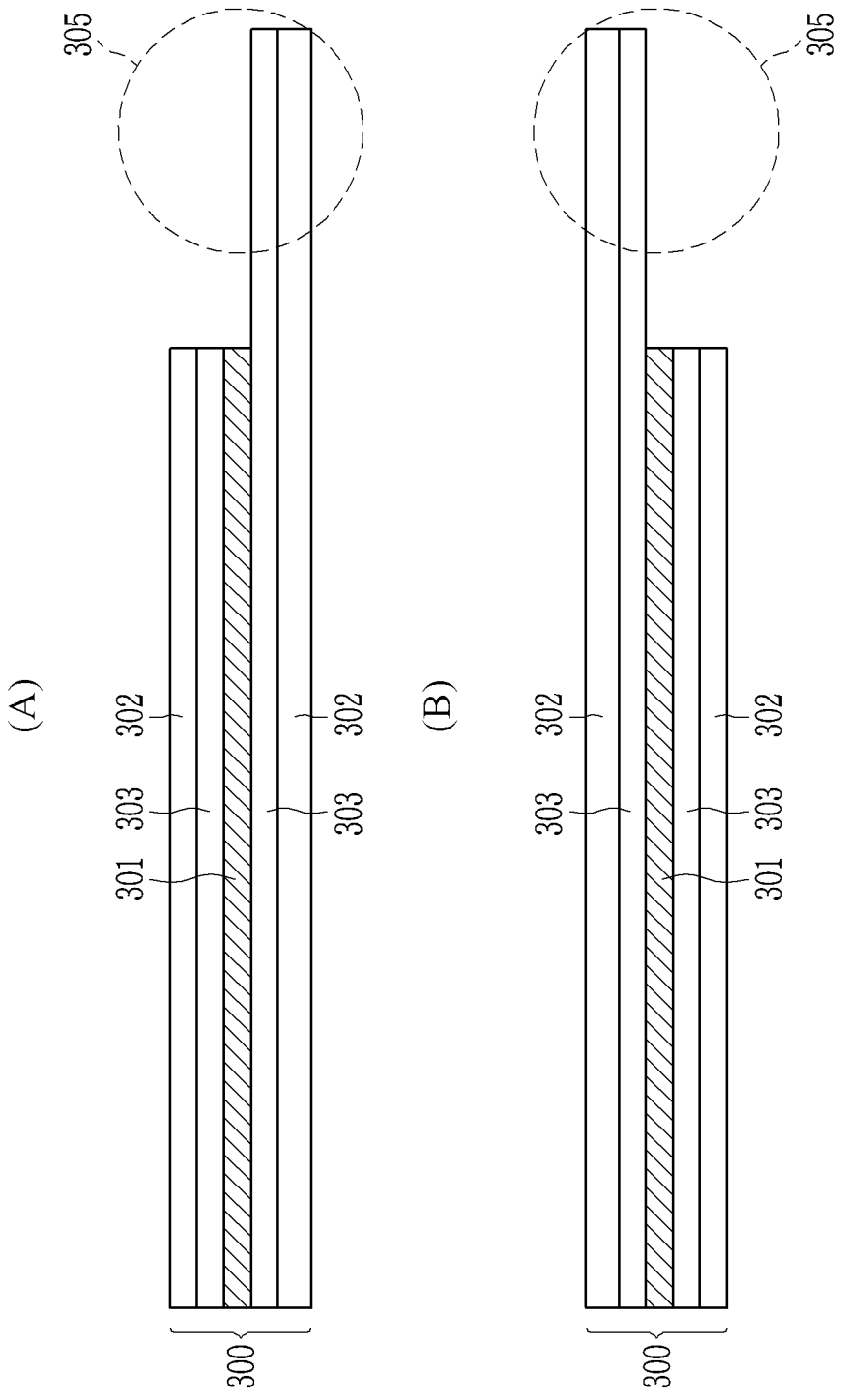
FIGS. 11 to 13 show exemplary variations of the base film shown in FIG. 10.
Figure 12:
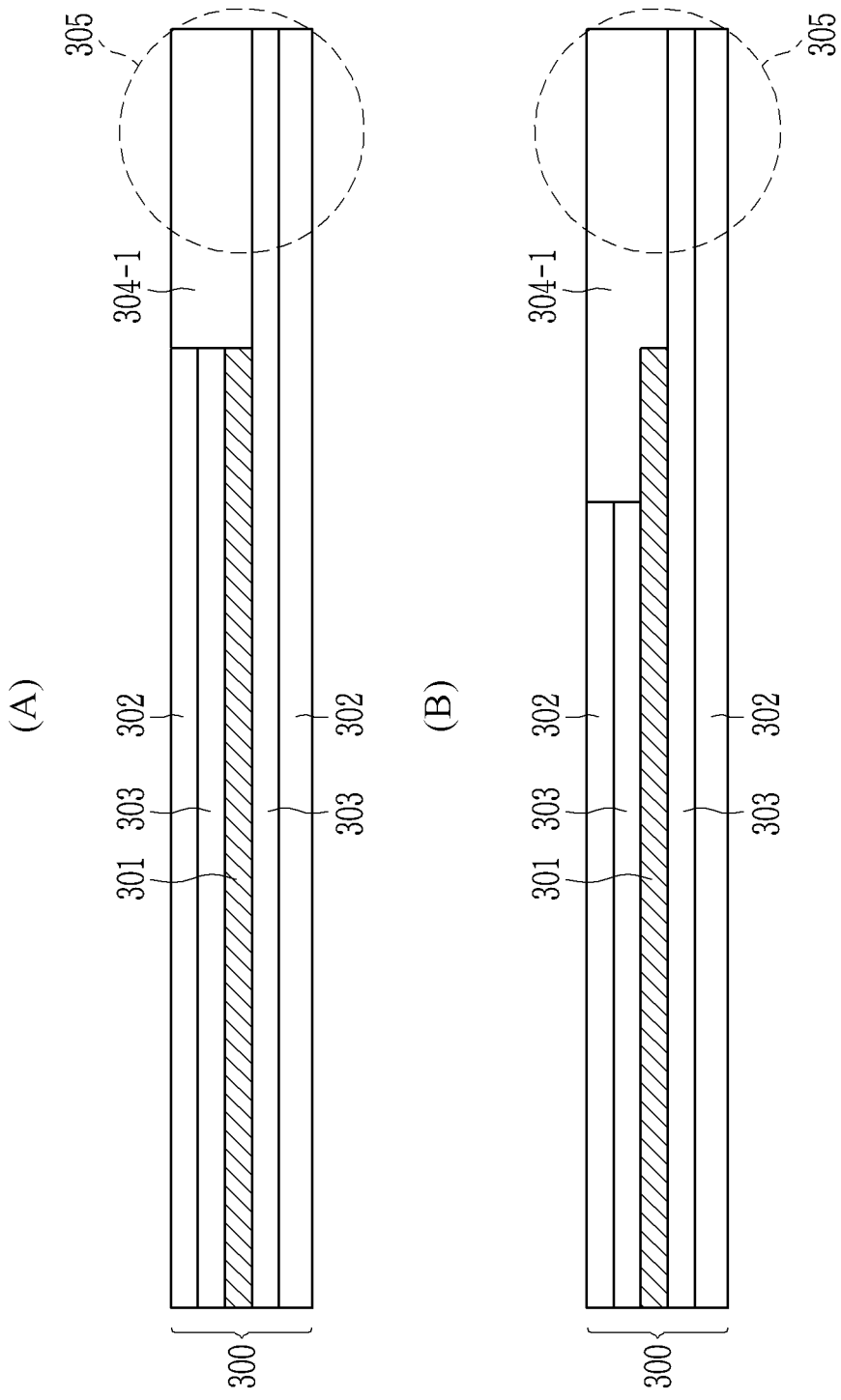
Figure 13:
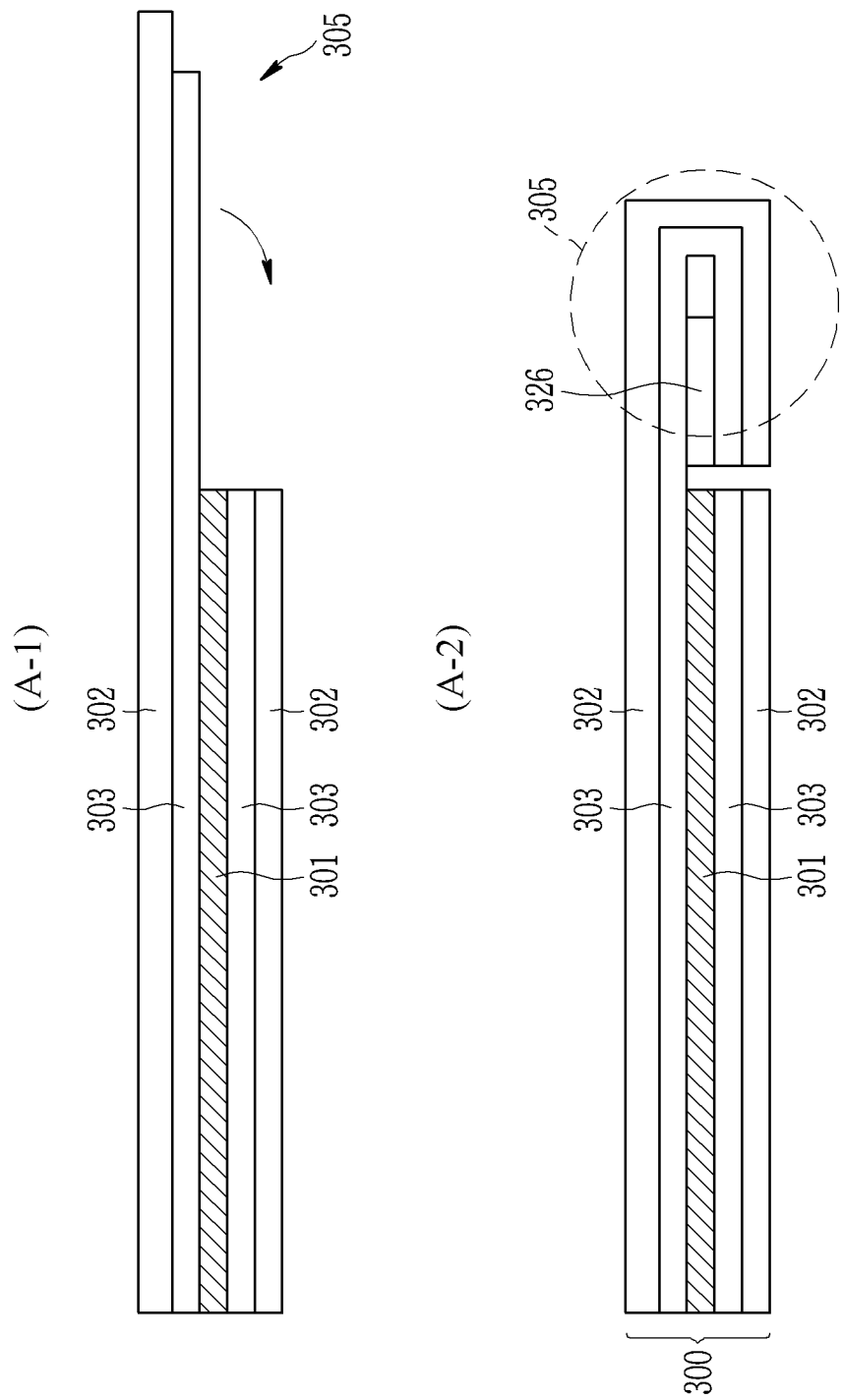

FIGS. 11 to 13 are exemplary variations of the base film according to FIG. 10.

FIG. 11 to FIG. 13 show a total of five exemplary embodiments. Also, FIG. 11 to FIG. 13 show the structure before the separation of the base film 300 and the external base film 305 like FIG. 10.

In the exemplary embodiment of FIG. 11 to FIG. 13, the structure of the base film region in which the metal layer 301 is disposed is the same as in FIG. 10, but the structure of the second base film region is different. Accordingly, it is described focusing only on the second base film region.

First, FIG. 11 is described. FIG. 11 shows the exemplary embodiments of FIG. 11 (A) and FIG. 11 (B).

The second base film region of the exemplary embodiment of FIG. 11 (A) is now described.

The second base film region of FIG. 11 (A) is configured of two layers, and has a structure in which the second coating layer 303 is disposed on the first coating layer 302. Compared with the second base film region of FIG. 10, the first and second coating layers 302 and 303 and the transparent layer 304 that are disposed on the top are omitted.

When using the structure formed like FIG. 11 (A), the external base film 305 is only formed of the first and second coating layers 302 and 303, thereby having the transparent structure.

On the other hand, according to an exemplary embodiment, the first and second coating layers 302 and 303 may be formed of one coating layer, and when being formed of one coating layer, the coating layer may be formed by using the polyimide-series material. In the above-described exemplary embodiment, the external base film 305 is also configured of one coating layer.

The second base film region of FIG. 11 (B) is configured of two layers, and differently from the structure of FIG. 11 (A), the overlying first coating layer 302 and second coating layer 303 are maintained. That is, the second coating layer 303 is disposed under the first coating layer 302, and compared with the second base film region of FIG. 10, the first and second coating layers 302 and 303 and the transparent layer 304 disposed on the bottom are omitted.

When using the structure formed like FIG. 11 (B), the external base film 305 is only configured of the first and second coating layers 302 and 303, thereby having the transparent structure.

On the other hand, according to an exemplary embodiment, the first and second coating layers 302 and 303 may be formed of one coating layer, and when being formed of one coating layer, the coating layer may be formed by using the polyimide-series material. In the above-described exemplary embodiment, the external base film 305 is also configured of one coating layer.

Next, an exemplary embodiment of FIG. 12 is described. FIG. 12 shows two exemplary embodiments of FIG. 12 (A) and FIG. 12 (B).

In the second base film region of FIG. 12 (A), the transparent insulating material is filled in an empty region in the second base film region of FIG. 11 (A) such that a second transparent layer 304-1 is additionally formed. The second transparent layer 304-1 may be formed of the same material as the transparent layer 304 or may be formed of a different material therefrom. That is, an OCR (optically clear resin), an OCA (optically clear adhesive), or a PSA (pressure sensitive adhesive) may be used, or PET (polyethylene terephthalate) may be used.

The second coating layer 303 and the first coating layer 302 are sequentially disposed under the second transparent layer 304-1.

When using the structure formed like FIG. 12 (A), the external base film 305 is formed of only the second transparent layer 304-1 and the first and second coating layers 302 and 303, thereby having the transparent structure.

On the other hand, according to an exemplary embodiment, the first and second coating layers 302 and 303 may be formed of one coating layer, and when being formed of one coating layer, the coating layer may be formed by using the polyimide-series material. In the above-described exemplary embodiment, the external base film 305 is also configured of one coating layer.

The second base film region of FIG. 12 (B) has a structure in which the structure of the second transparent layer 304-1 in the second base film region of FIG. 12 (A) extends to the top of the first base film region including the metal layer 301. The second base film region of FIG. 12 (B) is the same as the second base film region of FIG. 12 (A), thereby having the same layered structure as each other if the external base film 305 is formed.

However, when forming the exemplary embodiment of FIG. 12 (B), the structure of the first base film region is different such that the structure of the base film 300 is different from that of FIG. 10. The structure of the base film 300 according to the exemplary embodiment of FIG. 12 (B) is described as follows.

In the first base film region according to the exemplary embodiment of FIG. 12 (B), the first coating layer 302 and the second coating layer 303 are disposed up and down based on the metal layer 301, and the second transparent layer 304-1 is formed on the end of the second base film region side of the metal layer 301 instead of the first and second coating layers 302 and 303.

That is, the metal layer 301 is formed of the metal such as aluminum (Al), and may be the solid metal layer or the layer including the metal pattern according to an exemplary embodiment. The metal layer has the function of fixing the display device in some cases that the display device tends to again return to the original state when bending and folding the display device.

The second coating layer 303 is disposed on the metal layer 301 and the first coating layer 302 is disposed thereon. On the other hand, the second coating layer 303 is disposed under the metal layer 301, and the first coating layer 302 is disposed thereunder.

The first coating layer 302 and the second coating layer 303 are formed of the transparent material such as a polyimide, and in the present exemplary embodiment, the first coating layer 302 uses PI-H (Kapton® polyimide film), and the second coating layer 303 uses TPI (thermoplastic polyimide).

However, according to an exemplary embodiment, only one coating layer may be disposed above or below the metal layer 301. When forming one coating layer, the coating layer may be formed by using polyimide-series materials.

The second transparent layer 304-1 is formed on the end of the second base film region side of the metal layer 301 instead of the first and second coating layers 302 and 303. The size of the region apart from the second transparent layer 304-1 and the first and second coating layers 302 and 303 may be various.

The second transparent layer 304-1 may be formed of the same material as the transparent layer 304 or may be formed of a different material therefrom. That is, an OCR (optically clear resin), an OCA (optically clear adhesive), or a PSA (pressure sensitive adhesive) may be used, or PET (polyethylene terephthalate) may be used.

Differently from FIG. 12 (B), the structure of the second transparent layer 304-1 may extend to the bottom of the metal layer 301.

Next, the exemplary embodiment of FIG. 13 is described.

FIG. 13 shows one exemplary embodiment, and this is shown in FIG. 13 (A-2). FIG. 13 (A-1) is included to explain the method for manufacturing the exemplary embodiment of FIG. 13 (A-2).

The second base film region is described with reference to FIG. 13 (A-1).

As shown in FIG. 13 (A-1), the upper second coating layer 303 and the upper first coating layer 302 disposed on the first base film region extend to the second base film region have a shape extending toward the lower second coating layer 303 and the lower first coating layer 302 disposed on the first base film region while the right end is bent twice in the lower direction. As above-described, the second base film region is formed by the second coating layer 303 and the first coating layer 302 that are bent with a "⊃" structure. (referring to FIG. 13 (A-2))

On the other hand, referring to FIG. 13 (A-2), the second base film region further includes an adhesive layer 326. That is, the adhesive layer 326 is formed in the space formed due to the bending of the second coating layer 303 and the first coating layer 302 so that the second coating layer 303 and the first coating layer 302 are not again unfolded.

Differently from the exemplary embodiment of FIG. 13, only one coating layer may exist, and the one coating layer may be bent with the "⊃" structure. In this case, the one coating layer may be formed by using the polyimide-series material.

In each of the exemplary embodiments of FIG. 11 to FIG. 13, like FIG. 10, the first base film region and the second base film region are connected and then separated later so as to form the base film 300 and the external base film 305. Next, the base film 300 and the external base film 305 are attached to the rear surface of the display panel 100.

In the above exemplary embodiment, the method of attaching after the base film part 20 is divided into the base film 300 and the external base film 305 before being attached to the display panel part 10 was described.

Next, the method of dividing the base film into the base film 300 and the external base film 305 after the base film is attached is described with reference to FIG. 14.

FIG. 14 is a view showing a manufacturing method of a flexible display device according to an exemplary embodiment.

FIG. 14 only shows the base film as the base film part. However, a layer may be further included as well as the base film, different from FIG. 14. Also, FIG. 14 uses the exemplary embodiment of FIG. 11 (B) as the base film.

FIG. 14 (A) shows the state in which the base film part configured of only the base film is attached to the rear surface of the display panel 100.

In FIG. 14, the signal control chip 400 is indicated by a dotted line on the driving area of the display panel 100 so as to be divided into the driving area and the display area. The signal control chip 400 is indicated by the dotted line because the signal control chip 400 may be actually mounted after the base film part is attached to the display panel 100.

As shown in FIG. 14 (A), if the base film 300 of FIG. 11 (B) is attached to the display panel 100, the first base film part and the second base film part are not separated. To separate them, a laser is irradiated to cut the first coating layer 302 and the second coating layer 303 in the bending area among the driving area of the display panel 100. In this case, the part disposed under the display area of the display panel 100 is not damaged.

The structure as shown in FIG. 14 (B) is formed after the irradiation of the laser. That is, the first base film part 21 and the second base film part 22 are divided and attached to the rear surface of the display panel 100. Here, the second base film part 22 has the transparent structure, and contains the separated first coating layer 302-1 and the separated second coating layer 303-1.

In FIG. 14, the base film is only used as the base film part, the first base film part is configured of the base film 300, and the second base film part is configured of the external base film.

Since the external base film is transparent, the alignment key formed at the part where the signal control chip 400 is disposed is recognized from the bottom of the display panel 100 to mount the signal control chip 400 in the following process. As a result, the signal control chip 400 may be aligned.

Hereinafter, the flexible display device according to another exemplary embodiment of the present inventive concept is described with reference to FIG. 15.

FIG. 15 is a cross-sectional view of a flexible display device according to another exemplary embodiment.

In the exemplary embodiment of FIG. 15, differently from FIG. 14, the first base film part 21 and the second base film part 22 are formed of different materials from each other.

That is, the exemplary embodiment of FIG. 14 is a structure in which the second coating layer 303 and the first coating layer 302 of the first base film part 21 exist as is in the second base film part 22 such that they are formed of the same material.

In contrast, FIG. 15 shows the structure in which the first base film part 21 and the second base film part 22 are separately formed and separately attached. That is, the second base film part 22 of the exemplary embodiment of FIG. 15 includes a third transparent layer 306 and a fourth transparent layer 307, and is formed of the different material from the first coating layer 302 and the second coating layer 303 of the first base film part 21.

That is, the exemplary embodiment of FIG. 15 is the case in which the first base film 21 and the second base film 22 do not have the layers corresponding to each other. The case as shown in FIG. 15 is included in an exemplary embodiment of the present inventive concept.

In the exemplary embodiment of FIG. 15, since the external base film is only formed of the transparent material, the alignment key formed at the part where the signal control chip 400 is disposed is recognized from the bottom of the display panel 100 to mount the signal control chip 400 in the following process. As a result, the signal control chip 400 may be aligned.

According to an exemplary embodiment, the second base film part 22 may be configured of only one transparent layer.

In FIG. 14 and FIG. 15, the display panel 100 and the lower base film part are adhered by the adhesive, however the adhesive is not shown.

Figure 16:
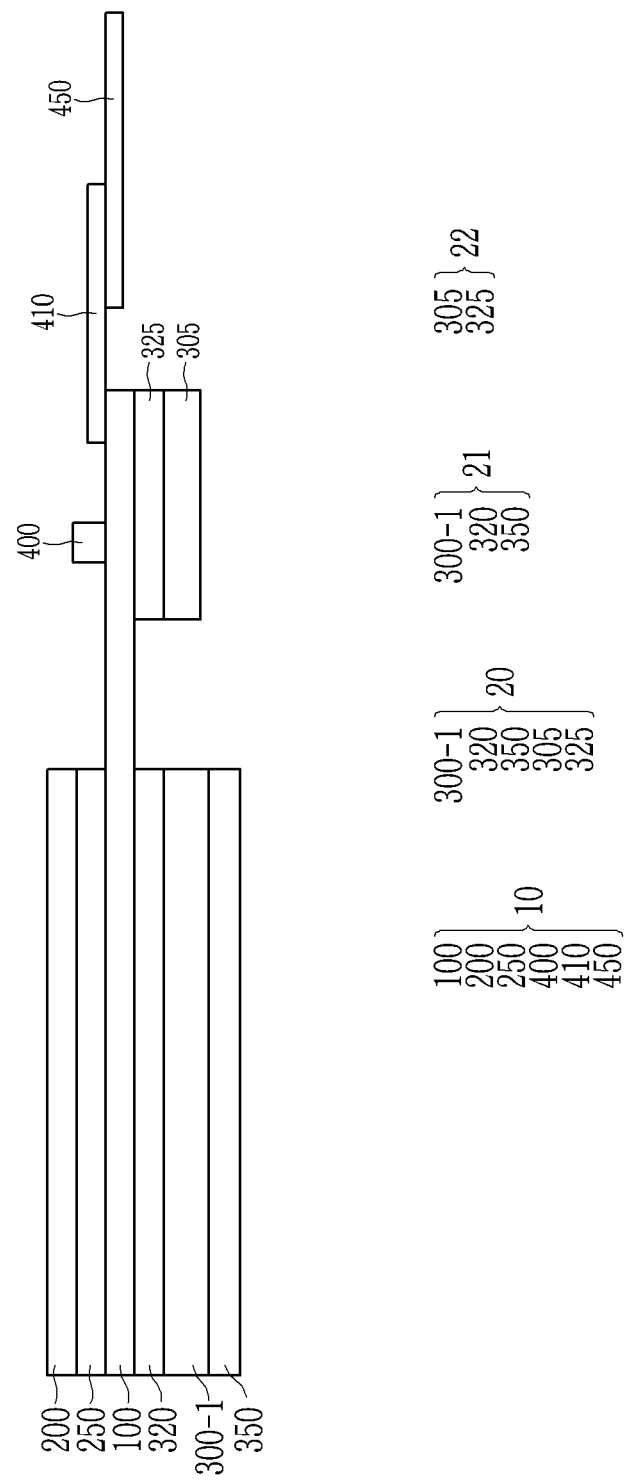
FIG. 16 is a cross-sectional view of a flexible display device according to another exemplary embodiment.

In the exemplary embodiment of FIG. 16, a base film 300-1 is formed by using a metal sheet instead of using the base film including the metal layer as shown in FIG. 1.

FIG. 16 is a cross-sectional view of a flexible display device according to another exemplary embodiment.

The exemplary embodiment of FIG. 16 is similar to the exemplary embodiment of FIG. 1, but there is a difference in use of the metal sheet instead of the metal layer.

Also, when using the metal sheet, the film layer 310 may be omitted according to an exemplary embodiment, and accordingly FIG. 16 shows the structure omitting the film layer 310 compared with FIG. 1. However, the film layer 310 may be added according to an exemplary embodiment.

The metal capable of being used in the metal sheet may be various, such as aluminum (Al).

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A flexible display device comprising:
a display panel comprising a flexible substrate having a display area and a driving area, wherein a signal control chip controlling the display panel is mounted on the driving area;
a first base film part attached under the flexible substrate and disposed corresponding to the display area; and
a second base film part attached under the flexible substrate and disposed under the driving area,
wherein the first base film part comprises a metal layer, a first coating layer disposed on a first surface of the metal layer, and a second coating layer disposed on a second surface of the metal layer which faces the first surface of the metal layer.

2. The flexible display device of claim 1, wherein the first base film part and the second base film part include at least one layer comprising the same material.

3. The flexible display device of claim 2, wherein the first base film part further includes an adhesive layer attached to a bottom of the display area.

4. The flexible display device of claim 3, wherein the second base film part includes an external adhesive layer comprising the same material as that of the adhesive layer of the first base film part.

5. The flexible display device of claim 3, wherein the first base film part further includes a film layer disposed between the adhesive layer and the first coating layer.

6. The flexible display device of claim 5, wherein the second base film part includes:
an external adhesive layer comprising the same material as that of the adhesive layer of the first base film part; and
an external film layer comprising the same material as that of the film layer of the first base film part.

7. The flexible display device of claim 1, wherein the second base film part includes a transparent layer disposed in a layer corresponding to the metal layer of the first base film part.

8. The flexible display device of claim 7, wherein the second base film part further includes coating layers disposed above and below based on the transparent layer.

9. The flexible display device of claim 7, wherein the second base film part further includes only one coating layer made of the same material as one of the first coating layer and the second coating layer, and the transparent layer is disposed on the only one coating layer in the second base film part.

10. The flexible display device of claim 9, wherein the transparent layer of the second base film part is disposed in a layer corresponding to the metal layer of the first base film part.

11. The flexible display device of claim 1, wherein the second base film part further includes only one coating layer made of the same material as one of the first coating layer and the second coating layer.

12. The flexible display device of claim 1, wherein the second base film part comprises a coating layer having a bent structure and an adhesive layer to fix the bent structure of the coating layer.

13. The flexible display device of claim 1, wherein the metal layer comprises a metal such as aluminum or a metal sheet.

14. The flexible display device of claim 13, further comprising
an alignment key disposed within the driving area of the display panel and disposed adjacent to the signal control chip.

15. The flexible display device of claim 13, further comprising:
a flexible printed circuit substrate attached on one side of the driving area of the display panel; and
a main printed circuit board (PCB) attached on one side of the flexible printed circuit substrate.

16. The flexible display device of claim 13, further comprising a touch panel disposed on the display panel and sensing a touch.

17. The flexible display device of claim 16, further comprising
a window disposed on the touch panel.

18. The flexible display device of claim 13, wherein
a cushion layer is further included under the metal layer as the first base film part.

19. The flexible display device of claim 13, further comprising a crack preventing layer disposed on a bending area,
wherein the bending area is disposed between the signal control chip and the first base film part.

20. The flexible display device of claim 13, further comprising a pressure sensor layer sensing a pressure disposed under the metal layer in the first base film part.

21. The flexible display device of claim 8, wherein the coating layers of the second base film part include two coating layers, respectively.

22. The flexible display device of claim 1, wherein the first base film part further comprises a third coating layer disposed on the first coating layer, and a fourth coating layer disposed below the second coating layer.

23. The flexible display device of claim 1, wherein the first base film part is opaque and the second base film part is transparent.

24. A flexible display device comprising:
a display panel comprising a flexible substrate having a display area and a driving area;
a signal control chip controlling the display panel and mounted on the driving area;
a first film attached under the flexible substrate, overlapping the display area in a plan view and comprising a non-transparent metal layer; and
a second film attached under the flexible substrate, overlapping the driving area in a plan view and comprising a transparent layer,
wherein the first film further comprises a first coating layer disposed on a first surface of the non-transparent metal layer and a second coating layer disposed on a second surface of the non-transparent metal layer which faces the first surface of the non-transparent metal layer.

25. The flexible display device of claim 24, wherein the second film also comprises a coating layer made of the same material as one of the first coating layer and the second coating layer.

* * * * *